United States Patent
Kwok

(10) Patent No.: US 6,326,672 B1
(45) Date of Patent: Dec. 4, 2001

(54) LOCOS FABRICATION PROCESSES AND SEMICONDUCTIVE MATERIAL STRUCTURES

(75) Inventor: Siang Ping Kwok, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/560,704

(22) Filed: Apr. 27, 2000

Related U.S. Application Data

(62) Division of application No. 09/385,698, filed on Aug. 30, 1999.

(51) Int. Cl.[7] ............................................. H01L 29/00
(52) U.S. Cl. ............................................. 257/506; 257/510
(58) Field of Search ........................................ 257/506–510; 438/426–445

(56) References Cited

U.S. PATENT DOCUMENTS

| | | | |
|---|---|---|---|
| 4,927,780 | 5/1990 | Roth et al. | 437/69 |
| 5,244,823 | 9/1993 | Adan | 437/41 |
| 5,326,715 | 7/1994 | Jang et al. | 437/70 |
| 5,360,753 | 11/1994 | Park et al. | 437/67 |
| 5,374,584 | 12/1994 | Lee et al. | 437/69 |
| 5,387,538 | 2/1995 | Moslehi | 437/67 |
| 5,393,692 | 2/1995 | Wu | 437/69 |
| 5,432,118 | 7/1995 | Orlowski et al. | 437/72 |
| 5,538,916 | 7/1996 | Kuroi et al. | |
| 5,563,091 | 10/1996 | Lee | 437/70 |
| 5,612,248 | 3/1997 | Jeng | |
| 5,629,230 | 5/1997 | Fazan et al. | 438/446 |
| 5,837,596 | 11/1998 | Figura et al. | |
| 5,891,789 | 4/1999 | Lee | |
| 5,956,600 | 9/1999 | Kuroi et al. | |
| 6,153,482 * | 11/2000 | Su et al. | 438/297 |

FOREIGN PATENT DOCUMENTS

| | | | |
|---|---|---|---|
| 0284456 * | 9/1988 | (EP) | |
| 56-103443 | 8/1981 | (JP) | |
| 57-63842 | 4/1982 | (JP) | 437/73 |
| 58-50754 | 3/1983 | (JP) | |
| 62-296436 | 12/1987 | (JP) | 437/72 |
| 01-282839 | 11/1989 | (JP) | |
| 2-116131 | 4/1990 | (JP) | |
| 02-266545 | 10/1990 | (JP) | |

OTHER PUBLICATIONS

Park, T., et al., "A Novel LOCOS–Type Isolation Technology Free of the Field Oxide Thinning Effect", *Solid State Devices and Materials*, Makuhari, 1993, pp. 528–530.
Wolf, S., "Silicon Processing for the VLSI Era", vol. II, pp. 20–27.

* cited by examiner

Primary Examiner—Tom Thomas
Assistant Examiner—Chong Quang Nguyen
(74) *Attorney, Agent, or Firm*—Wells St. John

(57) ABSTRACT

In one aspect, the invention encompasses a LOCOS process. A pad oxide layer is provided over a silicon-comprising substrate. A silicon nitride layer is provided over the pad oxide layer and patterned with the pad oxide layer to form masking blocks. The patterning exposes portions of the silicon-comprising substrate between the masking blocks. The masking blocks comprise sidewalls. Polysilicon is formed along the sidewalls of the masking blocks. Subsequently, the silicon-comprising substrate and polysilicon are oxidized to form field oxide regions proximate the masking blocks. In another aspect, the invention encompasses a semiconductive material structure. Such structure includes a semiconductive material substrate and at least one composite block over the semiconductive material substrate. The composite block comprises a layer of silicon dioxide and a layer of silicon nitride over the layer of silicon dioxide. The silicon nitride and silicon dioxide have coextensive opposing sidewalls. The structure also comprises polysilicon projections along the coextensive silicon nitride and second dioxide sidewalls.

7 Claims, 5 Drawing Sheets

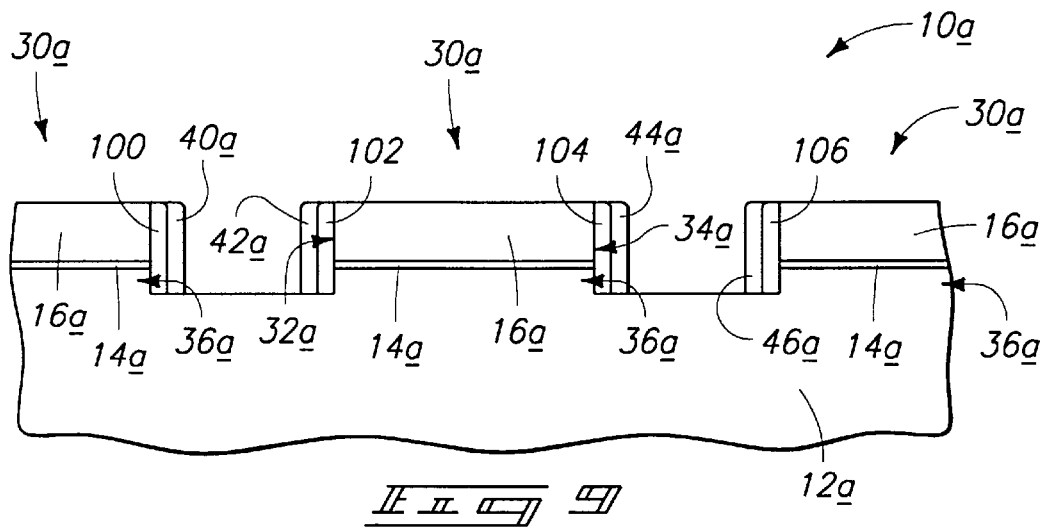
_Fig. 9_
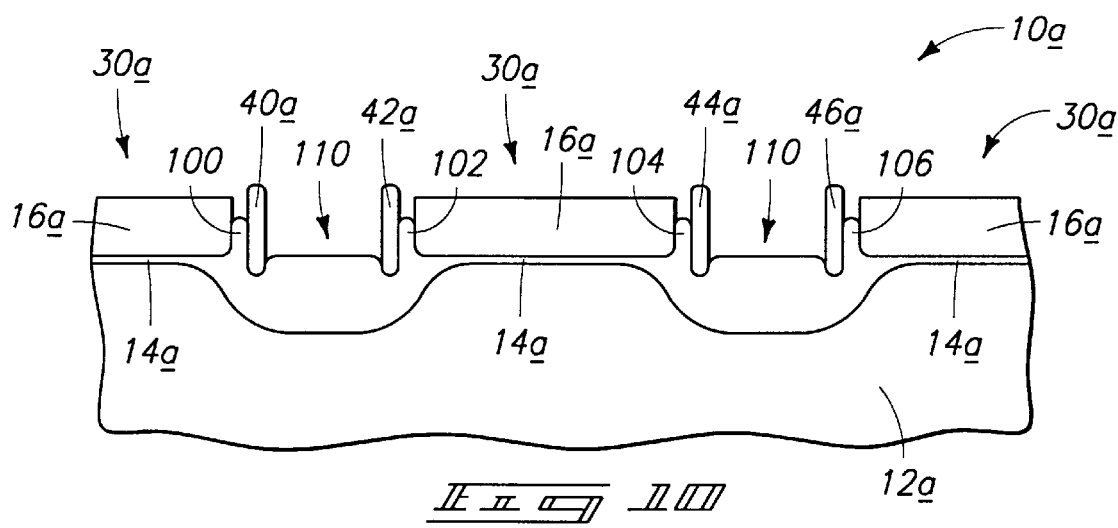
_Fig. 10_
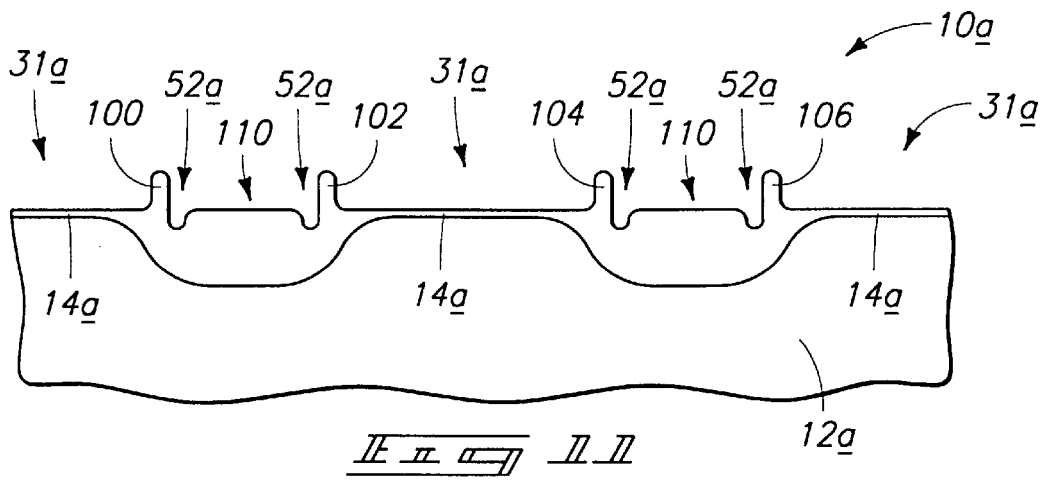
_Fig. 11_

US 6,326,672 B1

LOCOS FABRICATION PROCESSES AND SEMICONDUCTIVE MATERIAL STRUCTURES

RELATED PATENT DATA

This patent resulted from a divisional application of U.S. Pat. application Ser. No. 09/385,698, which was filed on Aug. 30, 1999.

TECHNICAL FIELD

The invention pertains to LOCOS methods of forming field oxide regions, and to semiconductive material structures.

BACKGROUND OF THE INVENTION

Local oxidation of silicon (LOCOS) is a method of forming field oxide regions on semiconductive material wafers. The field oxide regions can be utilized to electrically separate adjacent electrical devices which are formed over the semiconductive material wafer subsequent to the formation of the field oxide regions. A LOCOS process is described with reference to FIGS. 1–5.

Referring to FIG. 1, a semiconductive material wafer fragment 10 is illustrated at a preliminary step of a prior art LOCOS process. Wafer fragment 10 comprises a semiconductive material substrate 12 having a pad oxide layer 14 and a silicon nitride layer 16 formed thereover. Pad oxide layer 14 can comprise, for example, silicon dioxide, and is typically from about 20 nanometers to about 60 nanometers thick. Silicon nitride layer 16 is typically from about 100 nanometers to about 200 nanometers thick. Substrate 12 can comprise, for example, lightly doped monocrystalline silicon. To aid in interpretation of the claims that follow, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A patterned masking layer 18 is provided over silicon nitride layer 16. Patterned masking layer 18 can comprise, for example, photoresist patterned by a photolithographic process. Patterned masking layer 18 covers some portions (labeled as 20) of silicon nitride layer 16, and leaves other portions (labeled as 22) uncovered.

Referring to FIG. 2, wafer fragment 10 is subjected to etching conditions which remove uncovered portions 22 (FIG. 1) of silicon nitride material 16 to form openings 26. The etching also extends through pad oxide layer 14 and partially into silicon layer 12. Openings 26 can extend to, for example, about 500 Å into substrate 12.

The etching of openings 26 forms covered portions 20 of pad oxide 14 and silicon nitride 16 into masking blocks 30. Such masking blocks have opposing sidewall edges 32 and 34 (which are labeled only for the center masking block shown in FIG. 2). Also, the etching of openings 26 into substrate 12 forms pedestals 36 of the substrate material. Pedestals 36 have opposing sidewall surfaces coextensive with sidewall surfaces 32 and 34 of masking blocks 30.

Referring to FIG. 3, masking layer 18 (FIG. 2) is removed and silicon nitride projections 40, 42, 44 and 46 are formed along the sidewall edges of masking blocks 30 and pillars 36. Silicon nitride projections 40, 42, 44 and 46 can be formed to a thickness "T" of, for example, from about 100 Å to about 200 Å, and can be formed by depositing and anisotropically etching a layer of silicon nitride.

Referring to FIG. 4, wafer fragment 10 is subjected to oxidizing conditions to form field oxide regions 50. The oxidizing conditions can comprise, for example, wet oxidation conducted at temperatures of about 1,000° C. for a time of from about 2 hours to about 4 hours. The oxidation grows silicon dioxide from portions of substrate 12 between masking blocks 30. The growing silicon dioxide extends to under nitride projections 40, 42, 44 and 46 to from slight birds beak projections extending under silicon nitride layer 16 of masking blocks 30. Projections 40, 42, 44 and 46 limit an extent to which the oxide grows to under nitride layer 16 of masking blocks 30, and accordingly limits an amount of bird's beak formation.

Referring to FIG. 5, nitride layers 16, 40, 42, 44 and 46 are removed to leave field oxide 50 over substrate 12. Field oxide 50 has dips 52 formed therein where nitride projections 40, 42, 44 and 46 (FIG. 4) had been. Active area regions 31 are defined as regions between field oxide regions 50.

Pad oxide 14 remains over active area regions 31. In subsequent processing (not shown), pad oxide 14 can be stripped and replaced with another oxide layer. Subsequently, semiconductor devices, such as, for example, transistors can be formed between field oxide regions 50. Such devices will then be electrically separated from one another by field oxide regions 50.

Several difficulties occur in the processing described above with reference to FIGS. 1–5. Specifically, if nitride projections 40, 42, 44 and 46 are too thin, there will be excessive bird's beak encroachment under nitride layer 16. On the other hand, if nitride projections 40, 42, 44 and 46 are too thick, dips 52 will be excessively large, and will lead to sub-threshold kinks and other problems with circuitry ultimately formed over active area regions 31. It would therefore be desirable to develop alternative methods of LOCOS processing.

SUMMARY OF THE INVENTION

In one aspect, the invention encompasses a LOCOS process. A pad oxide layer is provided over a silicon-comprising substrate. A silicon nitride layer is provided over the pad oxide layer and patterned with the pad oxide layer to form masking blocks. The patterning exposes portions of the silicon-comprising substrate between the masking blocks. The masking blocks comprise sidewalls. Polysilicon is formed along the sidewalls of the masking blocks. Subsequently, the silicon-comprising substrate and polysilicon are oxidized to form field oxide regions proximate the masking blocks.

In another aspect, the invention encompasses a semiconductive material structure. Such structure includes a semiconductive material substrate and at least one composite block over the semiconductive material substrate. The composite block comprises a layer of silicon dioxide over the substrate and having a pair of opposing sidewalls. The opposing sidewalls of the silicon dioxide are a first silicon dioxide sidewall and a second silicon dioxide sidewall. The composite block further comprises a layer of silicon nitride over the layer of silicon dioxide and having a pair of opposing sidewalls. The opposing sidewalls of the silicon nitride are a first silicon nitride sidewall and a second silicon nitride sidewall. The first silicon nitride sidewall is coextensive with the first silicon dioxide sidewall and the second silicon nitride sidewall is coextensive with the second silicon dioxide sidewall. The structure also comprises a first polysilicon projection along the coextensive first silicon nitride sidewall and second dioxide sidewall, and comprises a second polysilicon projection along the coextensive second silicon nitride sidewall and second silicon dioxide sidewall.

BRIEF DESCRIPTION OF THE DRAWINGS

Preferred embodiments of the invention are described below with reference to the following accompanying drawings.

FIG. 9 is a view of the FIG. 6 wafer fragment shown at a processing step subsequent to that of FIG. 8.

FIG. 10 is a view of the FIG. 6 wafer fragment shown at a processing step subsequent to that of FIG. 9.

FIG. 11 is a view of the FIG. 6 wafer fragment shown at a processing step subsequent to that of FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A LOCOS process of the present invention is described with reference to FIGS. 6–11. In referring to FIGS. 6–11, similar numbering will be utilized as was used above in describing the prior art, with the suffix "a" utilized to indicate structures shown in FIGS. 6–11.

Figure 6:
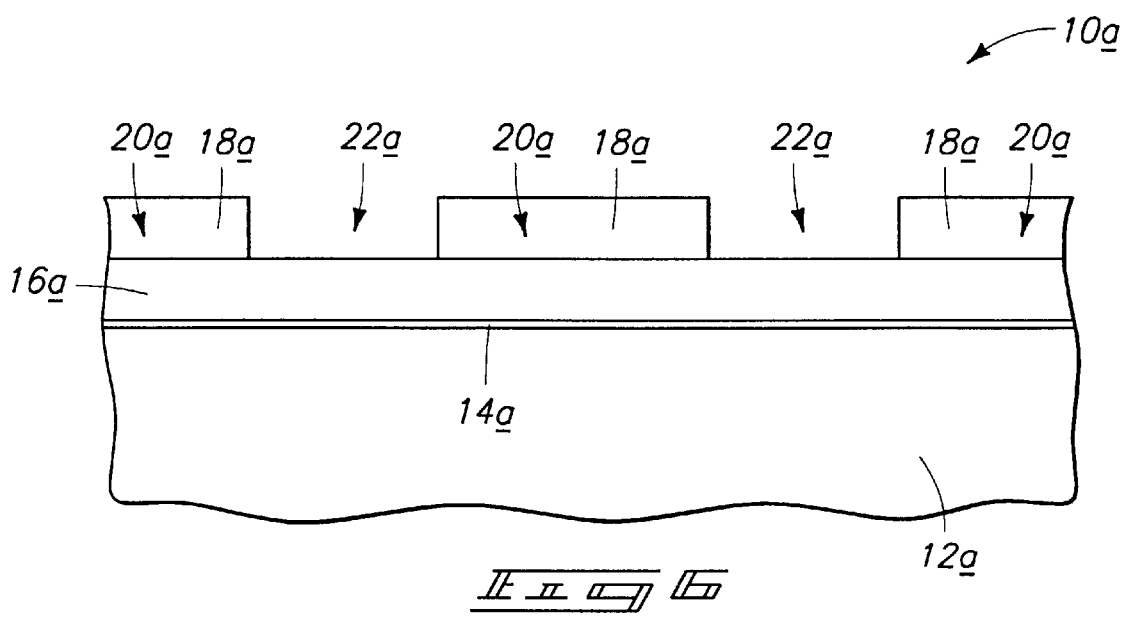
FIG. 6 is a diagrammatic, cross-sectional view of a semiconductive material wafer fragment shown at a preliminary step of a LOCOS process encompassed by the present invention.

Referring to FIG. 6, a semiconductive material wafer fragment 10a is shown at a preliminary step of a LOCOS process. Wafer fragment 10a comprises a substrate 12a, a pad oxide layer 14a, a silicon nitride layer 16a, and a patterned masking material 18a. Substrate 12a, pad oxide layer 14a, silicon nitride layer 16a, and masking material layer 18a can comprise constructions of materials identical to those discussed above regarding substrate 12, pad oxide 14, silicon nitride 16 and masking material 18, respectively, of the prior art. Alternate materials could, of course be used. Fewer or more layers could be used. Patterned masking layer 18a covers some portions (labeled as 20a) of silicon nitride layer 16a, and leaves other portions (labeled as 22a) uncovered.

Figure 7:
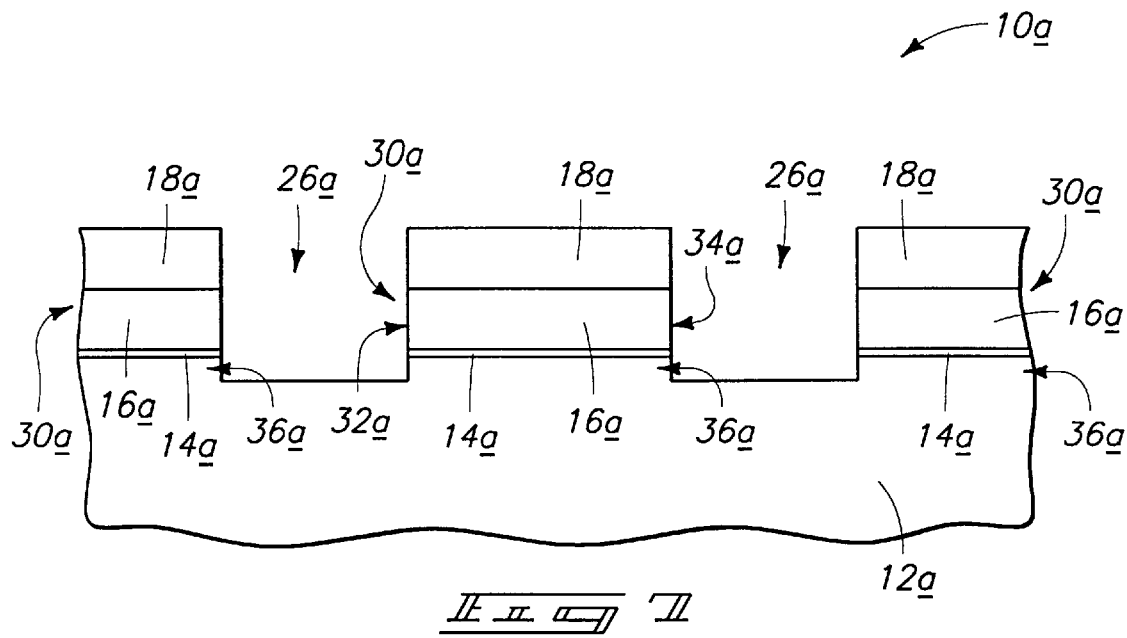
FIG. 7 is a view of the FIG. 6 wafer fragment shown at a processing step subsequent to that of FIG. 6.

Referring to FIG. 7, wafer fragment 10a is a subjected to etching conditions which etch openings 26a through layers 14a and 16a and into substrate 12a. Such etching defines masking blocks 30a having sidewalls 32a and 34a. Additionally, the formation of openings 26a defines pillars 36a of substrate 12a. Pillars 36a and masking blocks 30a have coextensive sidewalls.

Figure 8:
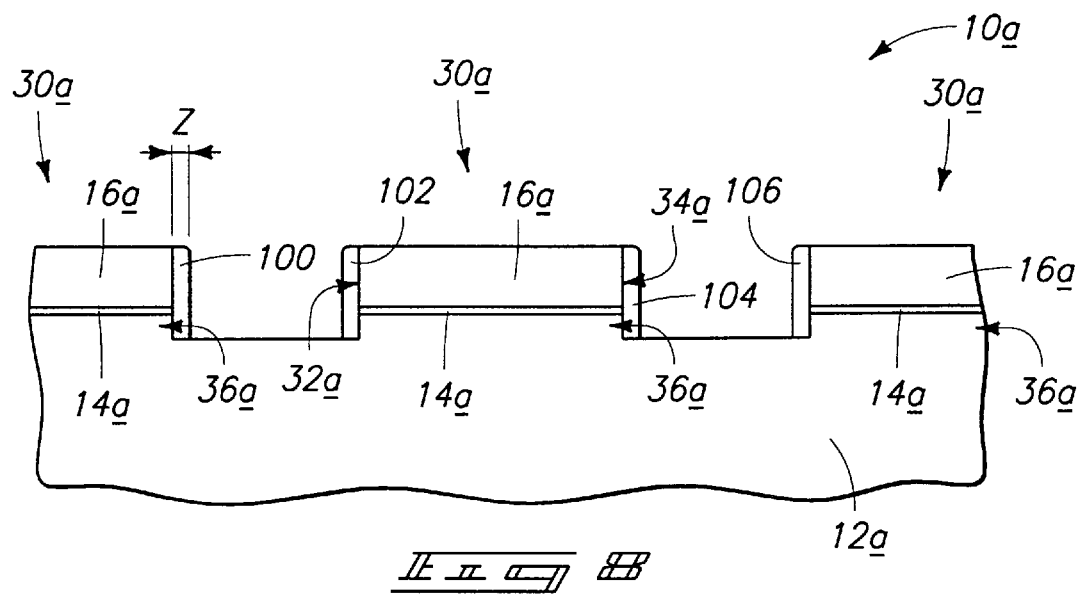
FIG. 8 is a view of the FIG. 6 wafer fragment shown at a processing step subsequent to that of FIG. 7.

Referring to FIG. 8, masking material 18a is removed. Also, polysilicon projections 100, 102, 104 and 106 are formed along sidewalls 32a and 34a of masking blocks 30a, as well as along the sidewalls of pillars 36a which are coextensive with sidewalls 32a and 34a. Polysilicon projections 100, 102, 104 and 106 can be formed to thicknesses "Z" of, for example, from about 200 Å to about 300 Å and can be formed by depositing and anisotropically etching a layer of polysilicon. The polysilicon of projections 100, 102, 104 and 106 is preferably undoped. Such polysilicon can be formed by, for example, chemical vapor deposition. In the shown embodiment, the polysilicon projections have a common height as the masking blocks 30a. However, it is to be understood that the invention encompasses other embodiments (not shown) wherein the polysilicon projections have a different height (either taller or shorter) than masking blocks 30a.

Referring to FIG. 9, silicon nitride projections 40a, 42a, 44a and 46a are formed along polysilicon projections 100, 102, 104 and 106. Silicon nitride projections 40a, 42a, 44a and 46a can be formed using methodologies similar to those described above for formation of silicon nitride layers 40, 42, 44 and 46 of the prior art. Silicon nitride layers 40a, 42a, 44a and 46a are separated from masking blocks 30a and pillars 36a by polysilicon projections 100, 102, 104 and 106, respectively. In the shown embodiment, the silicon nitride projections have a common height as the masking blocks and polysilicon projections. However, it is to be understood that the invention encompasses other embodiments (not shown) wherein the silicon nitride projections have a different height (either taller or shorter) than the masking blocks and polysilicon projections.

Referring to FIG. 10, wafer fragment 10a is subjected to oxidizing conditions which oxidize exposed portions of substrate 12a to form field oxide regions 110. The oxidizing conditions also oxidize the polysilicon of projections 100, 102, 104 and 106, and accordingly convert such projections to silicon dioxide. Silicon nitride projections 40a, 42a, 44a and 46a can reduce an amount of birds beak encroachment relative to the amount of encroachment which would occur without the silicon nitride projections. The oxidizing conditions can comprises, for example, wet oxidation conducted at temperatures of about 1,000° C. for a time of from about 2 hours to about 4 hours.

Figure 1:
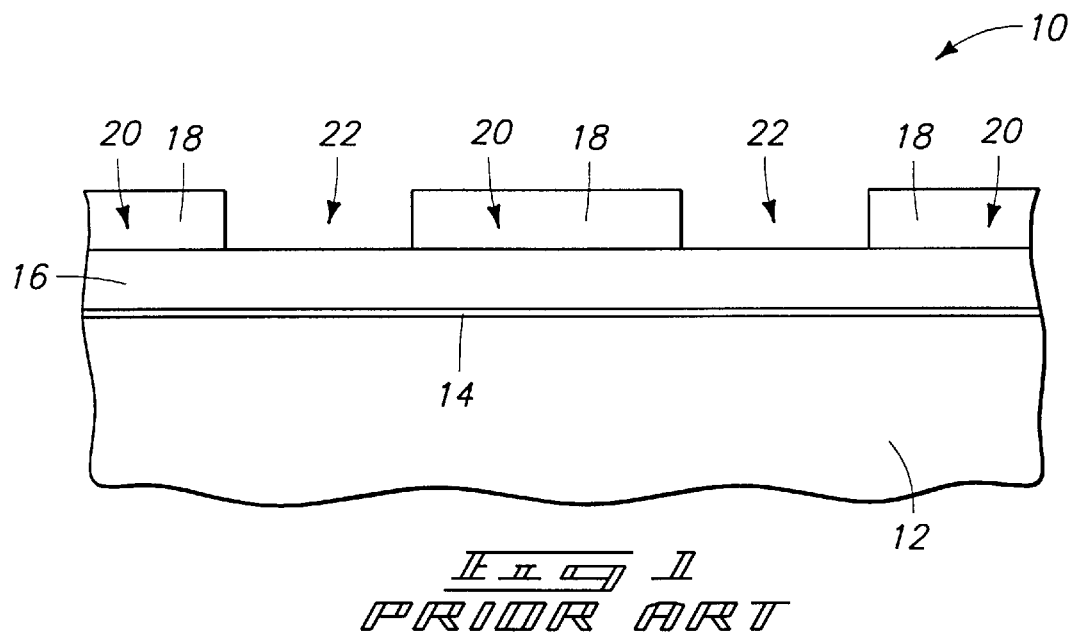
FIG. 1 is a diagrammatic, cross-sectional view of a semiconductive material wafer fragment shown at a preliminary processing step of a prior art LOCOS process.
Figure 2:
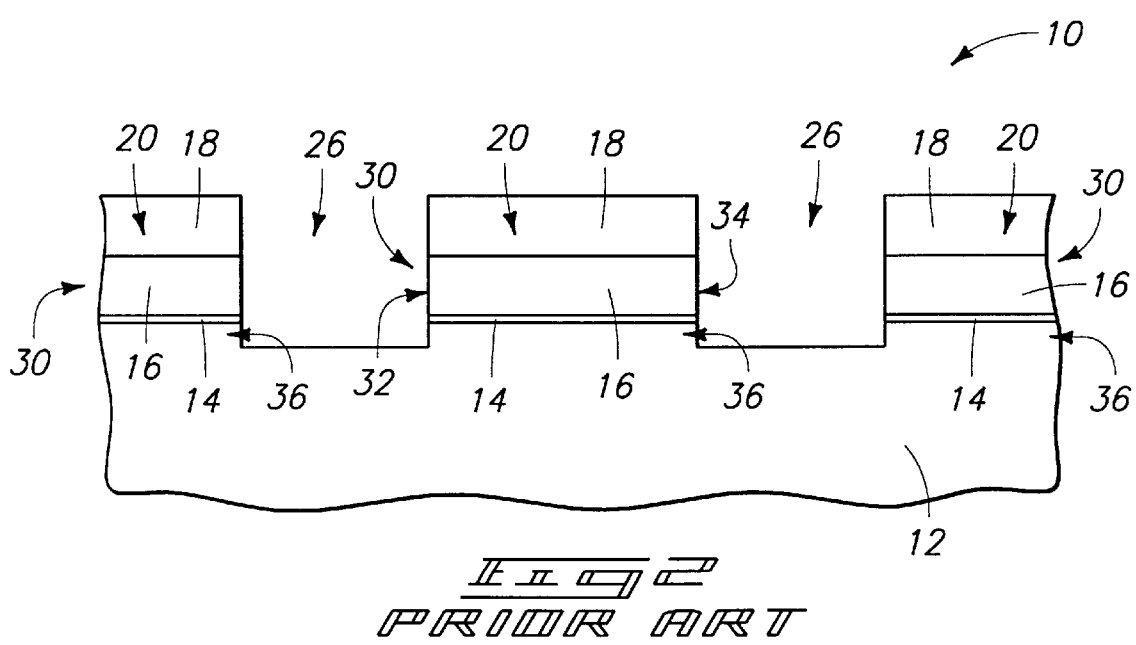
FIG. 2 is a view of the FIG. 1 wafer fragment shown at a prior art processing step subsequent to that of FIG. 1.
Figure 3:
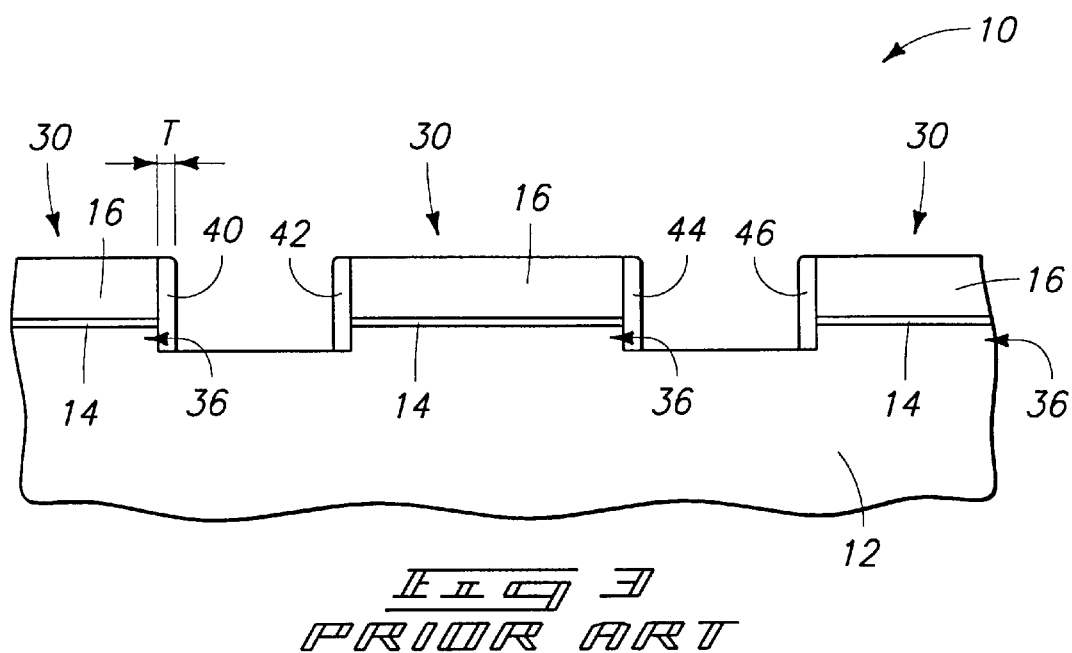
FIG. 3 is a view of the FIG. 1 wafer fragment shown at a prior art processing step subsequent to that of FIG. 2.
Figure 4:
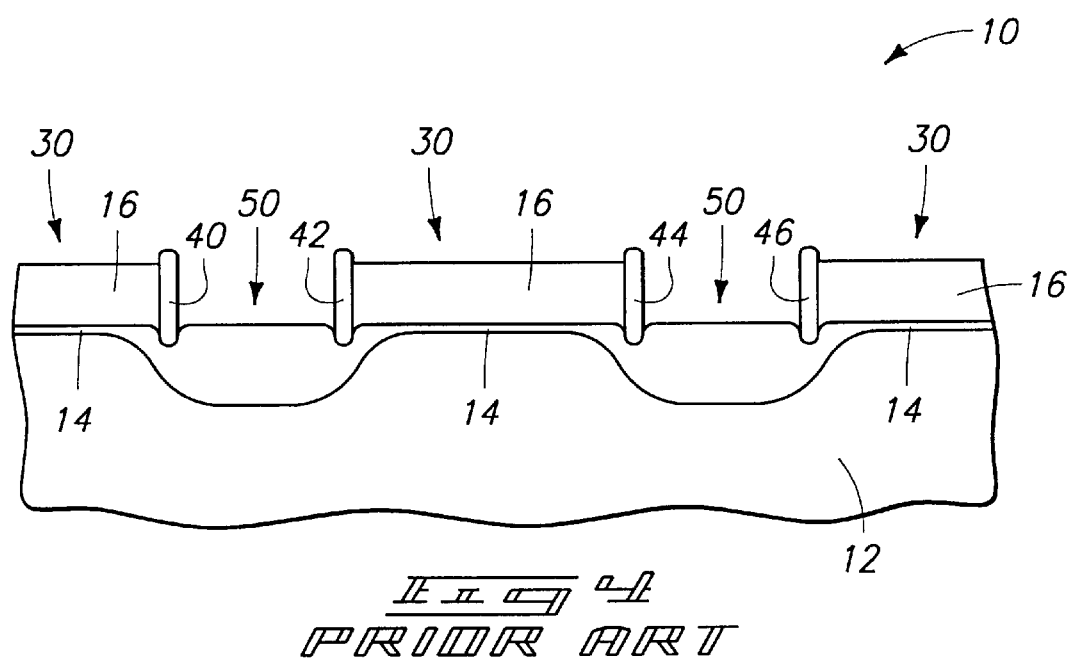
FIG. 4 is a view of the FIG. 1 wafer fragment shown at a prior art processing step subsequent to that of FIG. 3.
Figure 5:
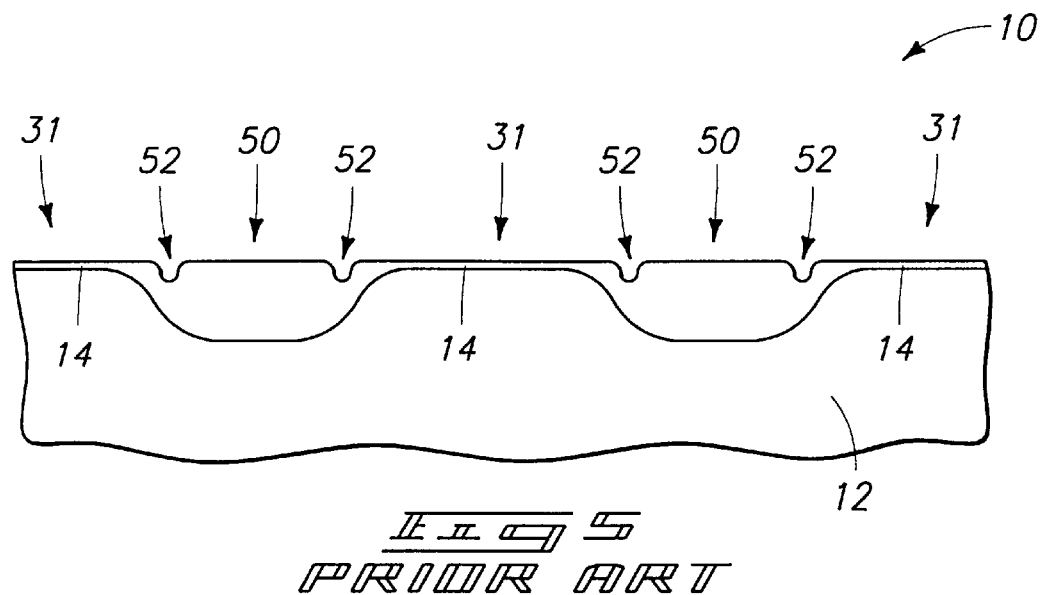
FIG. 5 is a view of the FIG. 1 wafer fragment shown at a prior art processing step subsequent to that of FIG. 4.

Referring to FIG. 11, silicon nitride materials 16, 40, 42, 44 and 46 are removed to leave field oxide regions 110 and pad oxide material 14a. Active area regions 31a are defined as regions extending between field oxide regions 110. Field oxide regions 110 have dips 52a associated therewith, which are similar to the dips 52 associated with the prior art field oxide structures 50 shown in FIG. 5. However, a difference between dips 52a of the present invention and dips 50 of the prior art is that dips 52a are spaced from active regions 31a by humps corresponding to oxidized polysilicon projections 100, 102, 104 and 106. Such spacing of dips 52a from active regions 31a and can reduce or eliminate the above-discussed problems associated with the dips 52 of the prior art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductive material structure comprising:
   a semiconductive material substrate; and
   at least one composite block over the semiconductive material substrate, the composite block comprising;
   a layer of silicon dioxide over the substrate and having a pair of opposing sidewalls, the opposing sidewalls being a first silicon dioxide sidewall and a second silicon dioxide sidewall; and
   a layer of silicon nitride over the layer of silicon dioxide and having a pair of opposing sidewalls, the opposing sidewalls being a first silicon nitride sidewall and a second silicon nitride sidewall, the first silicon nitride sidewall being coextensive with the first silicon dioxide sidewall and the second silicon nitride sidewall being coextensive with the second silicon dioxide sidewall;
   a first polysilicon projection along and in physical contact with the coextensive first silicon nitride sidewall and first silicon dioxide sidewall of the composite block and in physical contact with the substrate; and
   a second polysilicon projection along and in physical contact with the coextensive second silicon nitride sidewall and second silicon dioxide sidewall of the composite block and in physical contact with the substrate.

2. The structure of claim 1, further comprising:
   a first silicon nitride projection along the first polysilicon projection and separated from the coextensive first silicon nitride sidewall and first silicon dioxide sidewall by the first polysilicon projection; and
   a second silicon nitride projection along the second polysilicon projection and separated from the coextensive second silicon nitride sidewall and second silicon dioxide sidewall by the second polysilicon projection.

3. The structure of claim 1 wherein the at least one composite block is on a pillar of semiconductive material, the pillar having a pair of opposing sidewalls, one of the pillar opposing sidewalls being coextensive with the first silicon nitride sidewall and first silicon dioxide sidewall, the other of the pillar opposing sidewalls being coextensive with the second silicon nitride sidewall and second silicon dioxide sidewall, the first polysilicon projection being along said one pillar sidewall, and the second polysilicon projection being along said other pillar sidewall.

4. The structure of claim 1 wherein the at least one composite block is on a pillar of semiconductive material, the pillar having a pair of opposing sidewalls, one of the pillar opposing sidewalls being coextensive with the first silicon nitride sidewall and first silicon dioxide sidewall, the other of the pillar opposing sidewalls being coextensive with the second silicon nitride sidewall and second silicon dioxide sidewall, the first polysilicon projection being along said one pillar sidewall, and the second polysilicon projection being along said other pillar sidewall, the structure further comprising:
   a first silicon nitride projection along the first polysilicon projection and separated from the coextensive first silicon nitride sidewall, first silicon dioxide sidewall and said one pillar sidewall by the first polysilicon projection; and
   a second silicon nitride projection along the second polysilicon projection and separated from the coextensive second silicon nitride sidewall, second silicon dioxide sidewall and said other pillar sidewall by the second polysilicon projection.

5. The structure of claim 4 further comprising:
   a first field oxide region proximate the first silicon nitride projection and extending to under the first silicon nitride projection; and
   a second field oxide region proximate the second silicon nitride projection and extending to under the second silicon nitride projection.

6. A semiconductive material structure comprising:
   a semiconductive material substrate; and
   at least one composite block over the semiconductive material substrate, the composite block comprising;
      a layer of silicon dioxide over the substrate and having a pair of opposing sidewalls, the opposing sidewalls being a first silicon dioxide sidewall and a second silicon dioxide sidewall; and
      a layer of silicon nitride over the layer of silicon dioxide and having a pair of opposing sidewalls, the opposing sidewalls being a first silicon nitride sidewall and a second silicon nitride sidewall, the first silicon nitride sidewall being coextensive with the first silicon dioxide sidewall and the second silicon nitride sidewall being coextensive with the second silicon dioxide sidewall;
   a first silicon dioxide projection along the coextensive first silicon nitride sidewall and first silicon dioxide sidewall of the composite block;
   a second silicon dioxide projection along the coextensive second silicon nitride sidewall and second silicon dioxide sidewall of the composite block;
   a first silicon nitride projection along the first silicon dioxide projection and separated from the coextensive first silicon nitride sidewall and first silicon dioxide sidewall by the first silicon dioxide projection; and
   a second silicon nitride projection along the second silicon dioxide projection and separated from the coextensive second silicon nitride sidewall and second silicon dioxide sidewall by the second silicon dioxide projection.

7. The structure of claim 6 further comprising:
   a first field oxide region proximate the first silicon nitride projection and extending to under the first silicon nitride projection; and
   a second field oxide region proximate the second silicon nitride projection and extending to under the second silicon nitride projection.

* * * * *